METHOD FOR MANUFACTURING SEMICONDUCTOR DEVICES

Filed March 27, 1970 6 Sheets-Sheet 5

3,725,145
METHOD FOR MANUFACTURING SEMICONDUCTOR DEVICES

Michiyoshi Maki, Tokyo, Japan, assignor to Hitachi, Ltd., Tokyo, Japan
Filed Mar. 27, 1970, Ser. No. 23,235
Claims priority, application Japan, Mar. 28, 1969, 44/23,108
Int. Cl. H01l 7/44
U.S. Cl. 148—175 2 Claims

ABSTRACT OF THE DISCLOSURE

Semiconductor devices containing two diffused regions with different depths formed in a common semiconductor substrate are made by, for example, first selectively diffusing germanium into the surface of an N-type silicon crystalline substrate and, thereafter, selectively diffusing boron into the region containing then diffused germanium as well as into another surface portion of the substrate where the germanium has not been diffused.

BACKGROUND OF THE INVENTION

This invention relates to a method for manufacturing semiconductor devices, and especially to an improved process for selectively diffusing a conductivity type determining impurity into a semiconductor crystalline body to form diffused regions, at least two of which are different in diffusion depth, and to the products produced by the described method.

In fabricating semiconductor devices, especially semiconductor integrated circuit devices in which many circuit elements such as transistors, diodes, resistors and capacitors are formed in a common semiconductor substrate, the impurity diffusing process, especially a process in which a conductivity type determining impurity is selectively diffused into a semiconductor substrate, is very important. For example, it has been a requirement to be able to form diffused regions with different diffusion depths in a common semiconductor substrate. In fabricating a first transistor for a high frequency signal and a second transistor for large output power in a common semiconductor substrate, for instance, it is desirable to make the base width of the first transistor much smaller than that of the second transistor. Further, in fabricating plural resistor regions with different resistance values in a common semiconductor substrate, it is desirable to make the diffusion depths of the resistor regions different from each other in order to more efficiently use the surface area of the semiconductor substrate. Furthermore, especially in semiconductor integrated circuit devices, it is known that diffused isolation regions should be formed more deeply than other active diffused regions. According to the prior processes in which plural diffusing steps are employed to form such diffused regions with different depths, however, the diffusion conditions have to be controlled in each diffusing step, resulting in the disadvantages of complicated procedures and, high cost.

An ion-bombardment process has also been proposed in the prior art as another method for obtaining diffused regions with different depths. This method causes, however, large defects in the electrical characteristics due to lattice defects formed in the semiconductor body thereby.

SUMMARY OF THE INVENTION

One of the principal objects of this invention is to provide an improved method for fabricating semiconductor devices.

Another object is to provide an improved method for selectively diffusing an impurity into a semiconductor crystalline body and the products produced by the method.

A further object of the invention is to control the diffusion speed for an impurity in a semiconductor crystalline body.

Yet another object is to provide a method for fabricating at least two diffused regions different in depths from each other in a common semiconductor body and the products produced thereby.

A still further object of the invention is to provide a method for fabricating at least two transistors in which the base widths between emitter regions and collector regions are different from each other, and the transistors fabricated by this method.

A still further object is to provide a method for fabricating at least two diffused resistors, the diffusion depth of one of which is deeper than the other, and the resistors fabricated thereby.

A further object of the invention is to provide a method for fabricating a diffused region for isolating circuit elements from each other in a semiconductor integrated device, and the device fabricated by this method.

These and other objects and advantages of the present invention will become apparent to those skilled in the art from a consideration of the following specification and claims, taken in conjunction with the accompanying drawings.

In accordance with the present invention, a diffused semiconductor region is formed by the following steps:

(a) An element which does not affect the conductivity type of a semicondutcor substrate and which is different in crystal radius from the element constituting the diamond crystal structure of the semiconductor substrate is diffused into the semiconductor substrate to form a first diffused region and (b) Then a conductivity type determining impurity is diffused into the first diffused region.

According to one of the embodiments of the invention, a Column IV element (except silicon) in the Periodic Table such as germanium, tin, titanium, zirconium, hafnium or lead is selectively diffused into a silicon monocrystalline body to a predetermined depth to form a first diffused region and then an active or conductivity type determining impurity such as boron, aluminum, gallium, indium, arsenic, antimony or phosphorus is selectively diffused into said Column IV element-diffused first region and also at the same time into a second region of the silicon body where the Column IV element has not been diffused. In this method the diffusion of the active impurity is promoted by the existence of the Column IV element diffused in the first region, so that the active impurity is diffused more deeply in the first region than in the second region of the silicon body. The following explanation is hypothesized as one of the reasons for this phenomenon, although the inventor is not to be bound by the veracity of any theoretical explanation. While the ionic radius of silicon is 1.17 angstroms (A.), those of germanium, tin, titanium, zirconium, hafnium and lead are 1.22 A., 1.40 A., 1.44 A., 1.58 A., 1.56 A. and 1.44 A., respectively. The differences in ionic radius from silicon are, therefore, +0.05 A., +0.23 A., +0.27 A., +0.41 A., +0.39 A., +0.27 A., respectively. When such an element is doped in a silicon mono-crystalline body in a certain amount of concentration, it causes, therefore, internal stress or strain in the silicon body with expansion, swelling, contraction or shrinking of the crystal lattice in the silicon diamond crystalline structure. The activation energy for the diffusion of an impurity into a crystalline body is defined as the function of the lattice constant in the body. Also, the diffusing speed of an impurity depends on the lattice constant. It is, therefore, possible to control the diffusing speed of an impurity or to make the diffusing speed of an impurity partially different in a mono-crystalline body by controlling the lattice constant or by making the lattice constant partially different in the body. Especially, diffusing germanium or tin into a silicon mono-crystalline body enhances the following diffusion of an active impurity because of the resulting internal strain.

The foregoing and other objects, features and advantages of the invention will now be more particularly described in connection with preferred embodiments of the invention, as illustrated in the accompanying drawings;

FIGS. 1(*a*)–1(*e*) are sectional views representing a portion of an array of semiconductor devices during various steps for manufacture thereof according to the invention;

Figure 5:
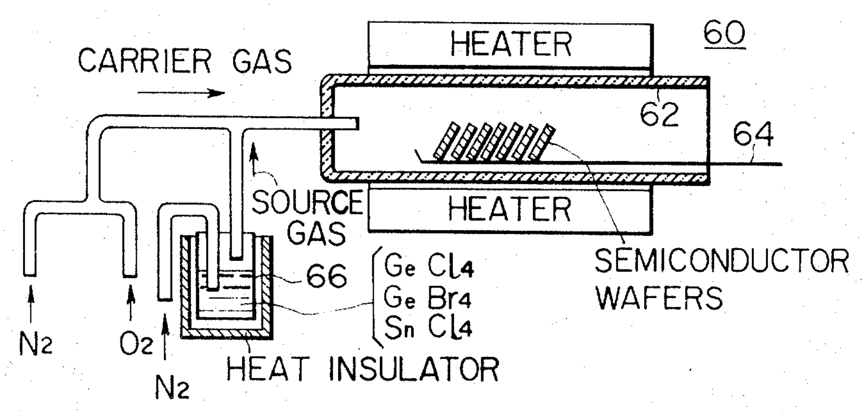
Figure 6A:
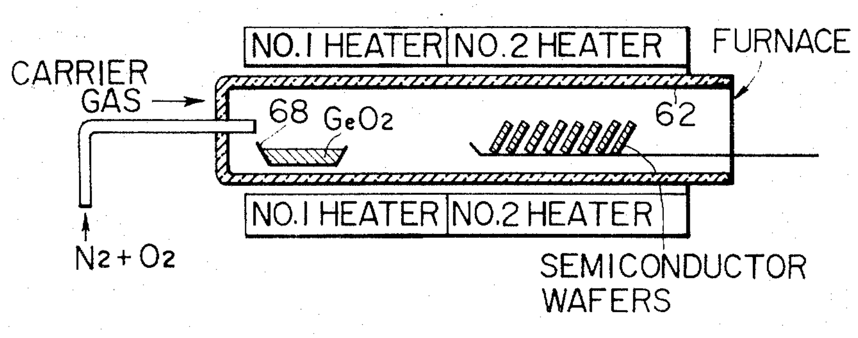
Figure 6B:
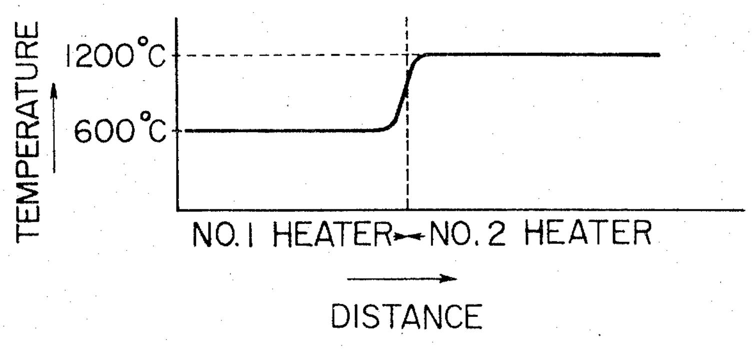
Figure 8:
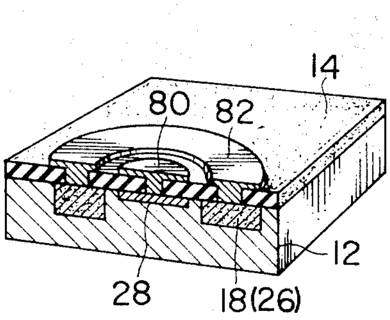
Figure 9A:
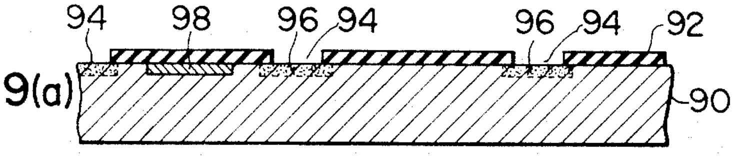
Figure 9B:
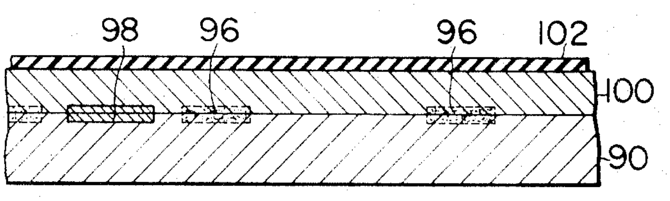
Figure 9C:
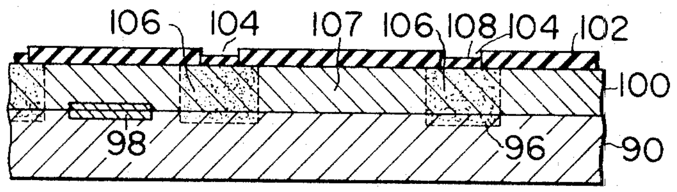
Figure 9D:
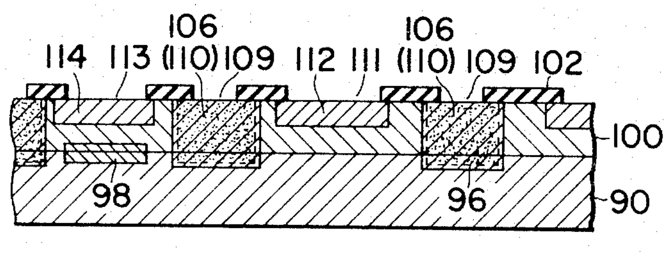
Figure 9E:
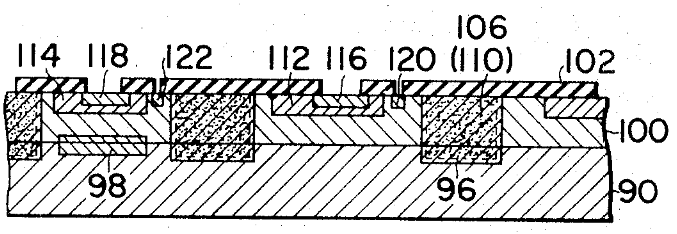
Figure 9F:
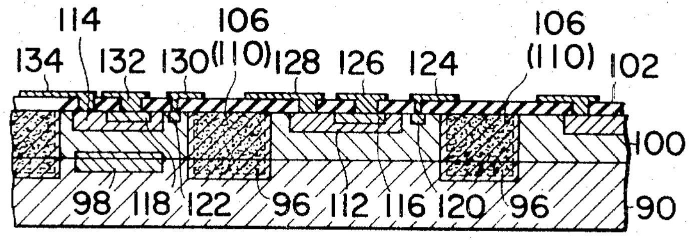
Figure 10A:
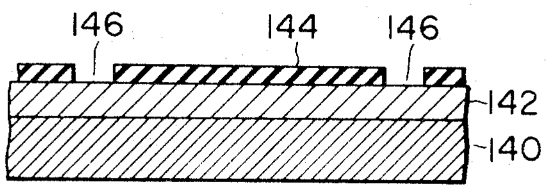
Figure 10B:
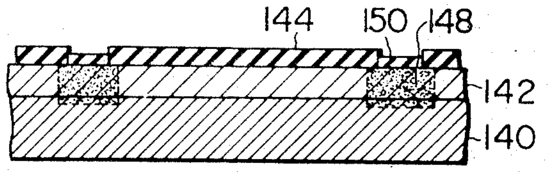
Figure 10C:
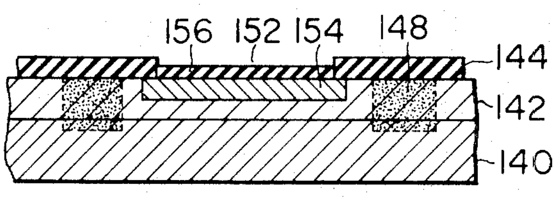
Figure 10D:
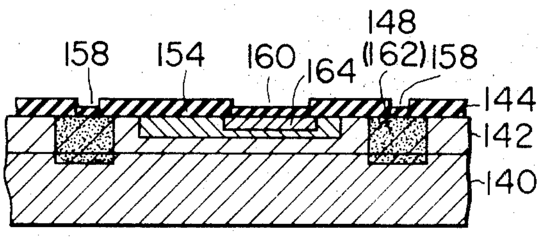
Figure 10E:
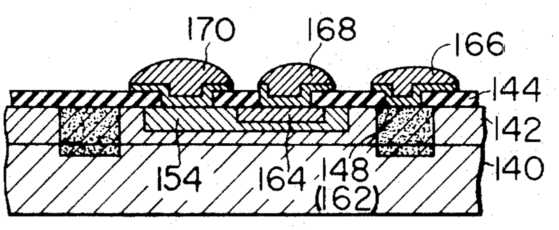
Figure 11A:
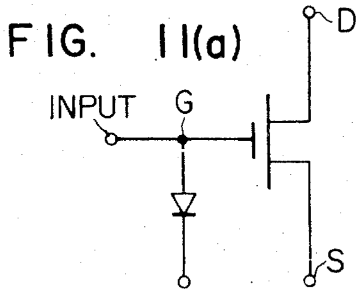
Figure 11B:
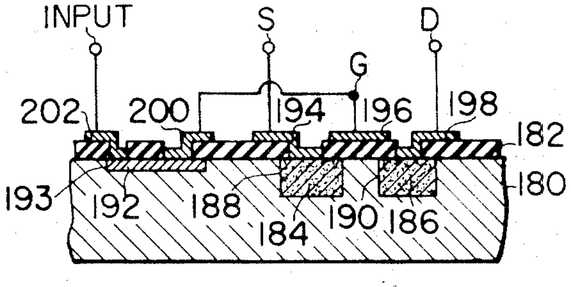

FIGS. 5, 6(*a*) and 7 are schematic diagrams showing the apparatus suitable for performing the invention;

FIG. 6(*b*) is a graph illustrating a desirable distribution of the heating temperature in the apparatus shown in FIG. 6(*a*);

FIG. 8 is a perspective view of a semiconductor device produced according to the invention;

FIGS. 9(*a*) to 9(*f*) and 10(*a*) to 10(*e*) are sectional views representing a portion of an array of a semiconductor integrated circuit device and a PNP transistor, respectively, during various steps for manufacture thereof according to the invention;

FIG. 11(*a*) is a schematic circuit diagram showing an insulated gate type field effect device with a protecting means; and FIG. 11(*b*) is a sectional view of an insulated gate type field effect transistor produced by the method according to the invention.

DESCRIPTION OF THE PREFERRED EMBODIMENTS

Example 1

The principal steps of manufacturing semiconductor devices according to the invention with a special embodiment for NPN silicon transistors formed in a common silicon mono-crystalline substrate are illustrated in FIGS. 1(*a*) to 1(*e*).

At first, as shown in FIG. 1(*a*), an N-type silicon monocrystalline substrate 12 having a major surface is covered with a protective insulating film 14, for example, a silicon oxide film of about 5000 A. to 6000 A. thickness which has an opening 16 to expose a part of the major surface of the substrate 12. The film 14 such as a silicon oxide film, may be provided by various means which are well known in the art as by electro-chemical treatment or by heating the substrate to between 900° C. to 1300° C. in an oxidizing atmosphere including steam and the opening or aperture 16 may be formed in the film 14 by conventional photo-engraving techniques. Then, as shown in FIG. 1(*b*), a Column IV element in the Periodic Table, such as germanium, tin, titanium, zirconium, hafnium or lead is selectively diffused into the substrate 12 through the opening 16 to form a first diffused region 18 by the various methods aftermentioned. In this diffusion step a new thin oxide film consisting essentially of silicon oxide (not shown in FIG. 1(*b*)) is formed on the surface of this first region 18. The region 18 has the same conductivity type, namely N-type, as the substrate 12, because such an element does not affect the conductivity type of the region. It is desirable that the surface concentration of such an element in the first diffused region 18 not be less than $10^{16}$ atoms/cm.$^3$. According to the results of many experiments, it has been found that a surface concentration of more than $10^{18}$ atoms/cm.$^3$ is more preferable.

In FIG. 1(*b*), the broken line 20 shows the interface between the substrate 12 and the diffused region 18, and this is defined as the borderline where such an element is included in the amount of $10^{16}$ atoms/cm.$^3$. In this particular embodiment, germanium is diffused into the substrate 12 to form a diffused region 18 with a surface concentration of about $10^{21}$ atoms/cm.$^3$, and the borderline 20 lies about 5 microns ($\mu$) below the major surface of the substrate. Therefore, the depth of the diffused region 18 is about 5$\mu$. It is also noted that the silicon oxide film 14 should have a thickness of not less than 4000 A. for masking the germanium diffusion. Then, as shown in FIG. 1(*c*), openings 22 and 24 are formed in the film 14 including the aforementioned new oxide film by conventional photo-engraving techniques in order to partially expose the surface of the first diffused region 18 and another region of the major surface of the substrate 12 in a place where the first region 18 has not been formed.

Then, as shown in FIG. 1(*d*), a P-conductivity type determining impurity such as boron is diffused into the first region 18 and the substrate 12 through the openings 22 and 24 to form P-type regions 26 and 28, respectively, by various conventional diffusion methods. In this step the impurity such as boron is diffused much more deeply in the first region 18 than in the other region of the substrate 12 because the existence of an element such as germanium or tin promotes the diffusion of the impurity such as boron, as discussed above. In this step, also, new oxide films 34 and 36 consisting essentially of silicon oxide are formed on the surface exposed by the openings 22 and 24.

In FIG. 1(*d*), 30 and 32 show the P-N junctions defined between the P-type diffused regions and the N-type substrate, and $D_1$ shows the difference in diffusion depths of the regions 26 and 28. In this particular embodiment, boron was diffused into the substrate 12 heated at a temperature of about 1200° C. to a depth of about 2$\mu$ and into the first region 18 to a depth of about 5$\mu$ with a depth difference $D_1$ of about 3$\mu$ and a surface concentration of about $10^{19}$ atoms/cm.$^3$. Then, openings (not shown in the drawings) are again formed in the film 14 including said newly formed oxide films 34 and 36 to partially expose the major surfaces of the P-type diffused regions 26 and 28, and by conventional diffusion techniques an N-type impurity such as phosphorus, antimony or arsenic is selectively diffused into said P-type regions 26 and 28 through the openings to form N-type regions 38 and 40 as shown in FIG. 1(*e*). In this diffusion step it is noted that the N-type regions 38 and 40 are formed with substantially the same depths, while the region 38 includes an element such as germanium.

The following hypothesis is believed to be one of the main reasons for this observation. Since germanium and boron are already included in the region 26 by the step of FIG. 1(*d*) and the ionic radius of boron is 0.88 A., namely a radius difference from silicon of −0.34 A., the expanded lattice resulting from the diffusion of germanium is contracted by the diffusion of boron. In other words, the expanded lattice is compensated by the diffusion of boron and the lattice constant in the region 26 becomes almost the same as that of the silicon substrate. In this embodiment, phosphorus is diffused in the P-type regions 26 and 28 through the openings in this step and N-type diffused regions 38 and 40 of about 1$\mu$ thickness are formed thereby.

Finally, openings are formed in the film 14 including the newly formed oxide film to partially expose the surfaces of the regions 38, 26, 40 and 28, and metal contacts, for example, aluminum contacts 42, 44, 46 and 48 are provided as shown in FIG. 1(*e*) by conventional metal evaporating techniques and photo-engraving techniques. Thus, two NPN type transistors $T_1$ and $T_2$ which have N-type emitter regions 38 and 40, P-type base regions 26 and 28, and N-type collector regions 50 and 52, respectively, are fabricated in the common semiconductor substrate 12. As shown in FIG. 1(*e*), it is to be noted that the transistors $T_1$ and $T_2$ have different base widths $W_1$ and $W_2$, namely while the transistor $T_1$ has a base width $W_1$ of about 4μ, the transistor $T_2$ has a base width $W_2$ of about 1μ. $T_1$ may be used as a transistor for large output power and $T_2$ may be used as a transistor for a high frequency signal.

Although, in this embodiment, means for isolating the transistors from each other are not illustrated in order to simplify the explanation of this invention, such means may be formed in the substrate 12 between the collector regions 50 and 52 by using the conventional methods or the aftermentioned methods. For example, PN junction isolation or dielectric isolation can be employed.

The methods for diffusing a Column IV element such as germanium and tin into a silicon substrate will be described hereafter referring to FIGS. 5 to 7. It is very practical to use germanium halides, such as $GeCl_4$, $GeBr_4$, or the oxides, for example, $GeO_2$ or GeSi as the impurity source to diffuse germanium into a silicon substrate and to use a tin halide, such as $SnCl_4$, to diffuse tin into a silicon substrate.

(A) The apparatus suitable to diffuse germanium or tin by using $GeCl_4$, $GeBr_4$ or $SnCl_4$ as an impurity source is illustrated in FIG. 5. The apparatus includes an open tube diffusion furnace 60 which contains an elongated quartz tube 62, with the left hand end of the tube being shown as the input end. A container 66 for holding $GeCl_4$, $GeBr_4$ or $SnCl_4$ is kept at a temperature of about 0° C. by a heat insulator. Nitrogen gas is fed into the container and the $N_2$ gas (source gas) saturated by $GeCl_4$, $GeBr_4$ or $SnCl_4$ is introduced into the tube 62 with a carrier gas consisting of nitrogen and oxygen. In the tube 62, semiconductor wafers are loaded on a quartz supporter 64 and the semiconductor wafers are heated at a temperature between 1050° C. to 1300° C. by a heater. Under the following condition, for example, germanium is diffused into a silicon wafer with a surface impurity concentration of about $10^{21}$ atoms/cm.$^3$:

| | |
|---|---|
| Impurity source | $GeCl_4$. |
| Carrier gas | $N_2$:4 l/min.<br>$O_2$:0.4 l/min. |
| Source gas | 20 to 50 cc./min. |
| Temperature of wafers | 1200° C. |
| Diffusion period | 1 hr. |

These conditions should be changed in accordance with the designed surface impurity concentration and/or the diffusion depth.

(B) The apparatus suitable to diffuse germanium by using $GeO_2$ as an impurity source is illustrated in FIGS. 6(*a*) and 6(*b*). The impurity source $GeO_2$ is loaded into a quartz boat 68 and a mixed carrier gas consisting of $N_2$ and $O_2$ is blown into an open end of quartz tube 62. It is desired to keep the distribution of the temperature in the tube 62 as shown in FIG. 6(*b*). The part where the boat 68 is disposed is heated at a temperature of about 600° C. by the No. 1 heater and the other part where the semiconductor wafers are disposed is heated at a temperature of about 1200° C. by the No. 2 heater.

Figure 7:
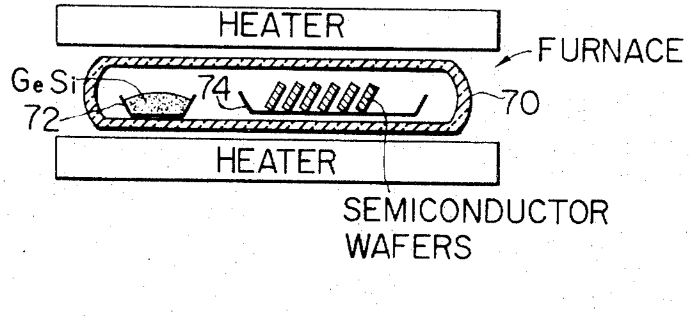

(C) The apparatus suitable to diffuse germanium by using a powder consisting essentially of alloyed GeSi as an impurity source is illustrated in FIG. 7. The furnace includes a closed quartz tube 70. The powder consisting essentially of alloyed GeSi and semiconductor wafers is loaded in quartz boats 72 and 74, respectively. It is desirable to keep the vapor pressure in the tube 70 at about $10^{-6}$ mm. Hg and to heat the wafers at about 1200° C. It is noted that the composition of the impurity source GeSi should be changed in accordance with a predetermined surface impurity concentration of the diffused region, as shown in the following table:

| Surface impurity concentration (atoms/cm.$^3$) | Composition of GeSi (atomic percent) Ge | Si |
|---|---|---|
| $10^{21}$ | 10 | 90 |
| $10^{20}$ | 1 | 99 |
| $10^{19}$ | 0.1 | 99.9 |

Example 2

Figure 1A:
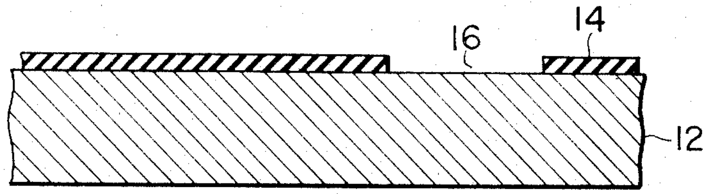
Figure 1B:
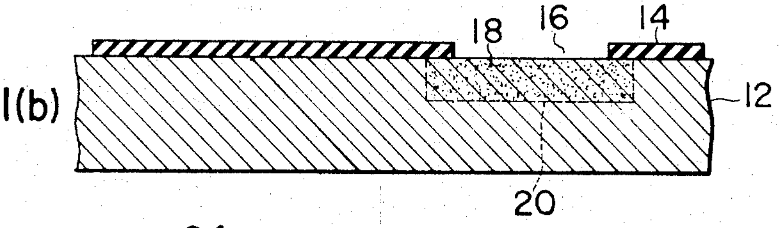
Figure 1C:
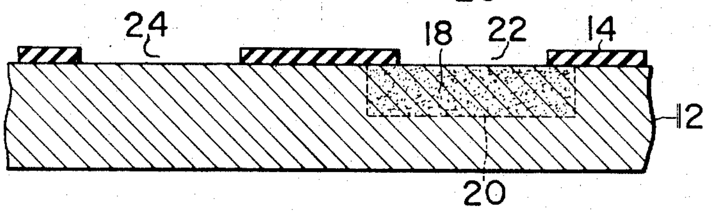
Figure 1D:
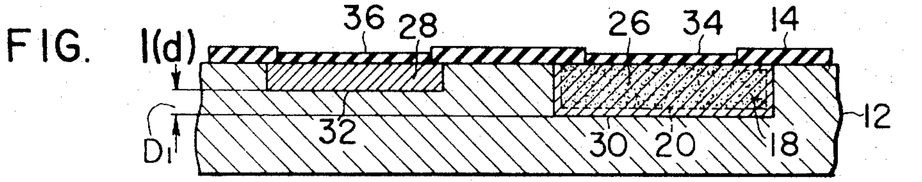
Figure 1E:
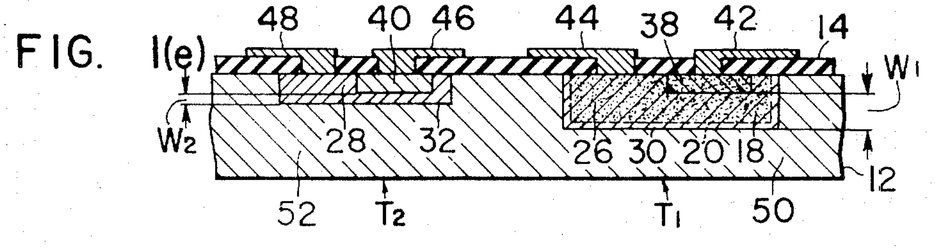
Figure 2:
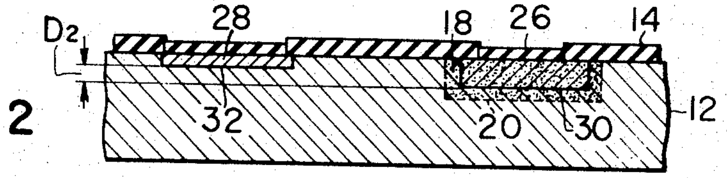
FIGS. 2 and 3 are sectional views for explaining other other modifications according to the invention.
Figure 3:
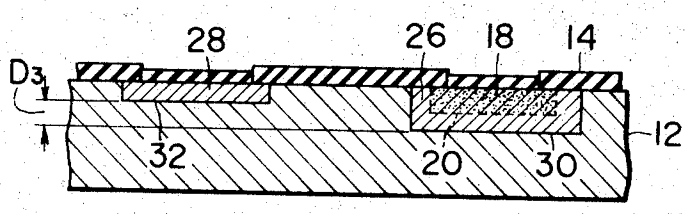
Figure 4:
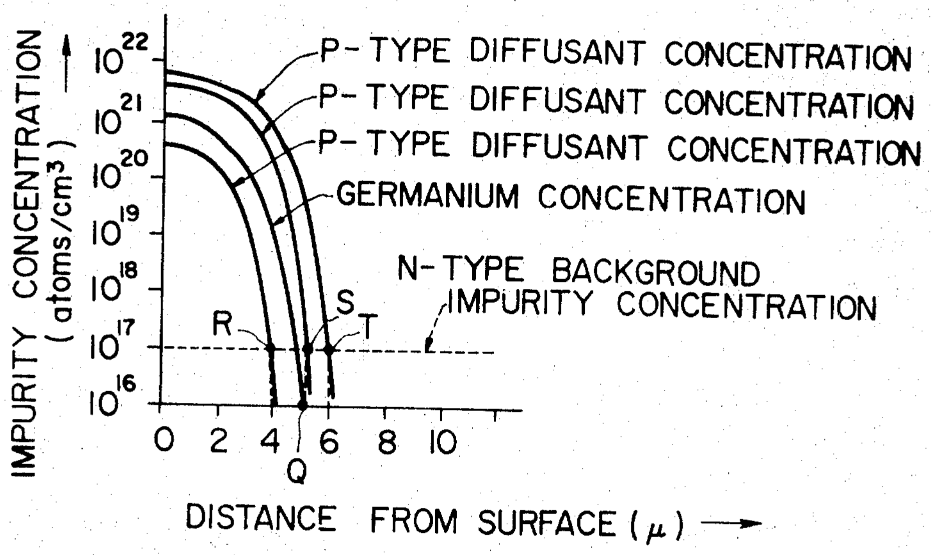
FIG. 4 is a graph illustrating distribution of impurity concentration in a semiconductor device produced according to the invention.

Now, referring to FIGS. 2, 3 and 4, a modification of the method according to the invention is explained. The method for fabricating semiconductor devices according to this Example 2 is the same as in Example 1 except the step for boron diffusion as shown in FIG. 1(*d*). While in the boron diffusing step of Example 1 boron is diffused into the semiconductor substrate 12 up to a depth of about 2μ and into the first region 18 up to a depth of about 5μ, in this example boron is diffused more deeply or to a more shallow extent than in Example 1. As shown in FIG. 2, when boron is diffused into the substrate 12 up to about 1μ depth, boron is diffused into the first region 18 up to about 4μ. On the other hand, as shown in FIG. 3, when boron is diffused into substrate 12 up to about 4μ depth, boron is diffused into the first region up to about 6μ depth. The difference $D_3(=2\mu)$ in diffusion depth in FIG. 3 is smaller than that $D_2(=3\mu)$ in FIG. 2. According to these experiments, it is noted that the difference D in diffusion depth can be controlled by diffusing an impurity such as boron into the substrate 12 or the first region 18 up to a predetermined depth. And, it is also to be noted that if a larger difference D in diffusion depth is desired, an impurity such as boron should be diffused into the first region 18 up to the depth of the borderline 20 for germanium or with substantially the same depth as the first region.

This description will be easily understood by referring to FIG. 4 which illustrates the distribution of the impurity concentration in the first region in which an element such as germanium or tin is already diffused. In FIG. 4 the points R, S and T designate the positions of the PN junction formed by diffusing boron into the N-type first region 18 and the point Q indicates the position of the borderline for the first region 18 where germanium is included by an amount of not less than $10^{16}$ atoms/cm.$^3$.

Example 3

Plural diffused resistors, at least two of which have different diffusion depths, are fabricated in a common substrate by the same steps as in FIG. 1(*a*) through FIG. 1(*d*) in Example 1. Namely, instead of the step for emitter diffusion in FIG. 1(*e*), two openings are separately formed in each of the newly formed oxide films 34 and 36 in FIG. 1(*d*) and then metal contacts are provided therein to fabricate two diffused resistors 26 and 28 which are different in depth from each other.

Example 4

Referring to FIG. 8, a PNP lateral transistor fabricated by the method of the invention will be explained. The PNP lateral transistor is also fabricated through the same steps from FIG. 1(*a*) to FIG. 1(*d*) in Example 1 except the shape of the first diffused region 18. Namely, in FIG. 1(*a*) an opening 16 is formed with a ring shape in the film 14, and then germanium or tin is diffused into the substrate 12 through the opening 16 to form a ring shaped first region 18 as shown in FIG. 8. Openings 22 and 24 are then formed in the film 14 on the first diffused region 18 and on the major surface of the substrate surrounded by the ring shaped first region 18, respectively. After that an emitter electrode 80 and a collector electrode 82 are provided by conventional metal evaporation techniques and photo-engraving techniques. A base electrode may be formed on the bottom surface or on the major surface of the substrate 12. The thus-produced transistor has good electrical characteristics such as a high current amplification factor.

Example 5

Referring to FIGS. 9(*a*) to 9(*f*), a method for fabricating a semiconductor integrated circuit device according to the invention will be described hereinafter. At first, a major surface of a P-type silicon monocrystalline substrate 90 is covered by an insulating film 92 such as a silicon oxide film of about 5000 to 7000 A. thickness. An opening 94 with a lattice shape is formed in the film 92 and germanium or tin is selectively diffused into the substrate 90 to form a first diffused region 96 of about 3$\mu$ depth with a surface concentration of not less than $10^{16}$ atoms/cm.$^3$ as shown in FIG. 9(*a*). In this diffusion step a new thin oxide film is formed on the substrate surface exposed by said opening 94. Then the insulating film 92 including the newly formed oxide film is removed by an etchant and the major surface of the substrate is cleaned up. An N-type silicon epitaxial layer 100 of about 10$\mu$ thickness is grown up on the entire major surface as shown in FIG. 1(*b*). In this step diffusion of the previously diffused element such as germanium or tin may occur somewhat in the region inside of the epitaxial layer 100. An insulating film 102 such as a silicon oxide film is again formed on the surface of the epitaxial layer 100 with a thickness of about 5000 A. to 7000 A. Then, as shown in FIG. 9(*c*), an opening 104 is formed in the film 102 with a lattice shape to partially expose the surface of the epitaxial layer 100 just over the first diffused region 96, and through the opening 104 an element such as germanium or tin is diffused into the epitaxial layer 100 to make the second diffused region 106 with a surface concentration of not less than $10^{18}$ atoms/cm.$^3$ to contact with the first region 96. In this diffusion step a new oxide film 108 is formed on the surface of the second region. Thus, an N-type epitaxial region 107 surrounded by the first and second diffused regions 96 and 106 is created.

Then, as shown in FIG. 9(*d*), openings 109 and 111 are formed in the oxide film including the new oxide film to partially expose a part of the surface of the second diffused region 106 and a part of the surface of the epitaxial layer 100 surrounded by the opening 109, respectively. A P-type impurity such as boron is selectively diffused into the semiconductor material through said openings 109 and 111. It is noted, in this diffusing step, that boron is diffused much more deeply into the second diffused region 106 than into the epitaxial layer 100, so that a P-type region 110 of about 13$\mu$ depth contacted with the P-type substrate 90 and a P-type region 112 of about 3$\mu$ depth are formed in the same step. In this step thin oxide films are provided on the exposed surface of the semiconductor materials. Then, as shown in FIG. 9(*e*), N-type regions 116, 118, 120 and 122 are formed by selectively diffusing phosphorus through newly formed openings in the film 102. Finally, as shown in FIG. 9(*f*), metal contacts, for example, aluminum contacts 124, 126, 128, 130, 132 and 134 are provided to contact with the diffused regions 120, 116, 112, 122, 118 and 114, respectively, to fabricate two transistors by conventional metal evaporating techniques. The P-type diffused region 110 operates to isolate the two transistors from each other. If a lower collector resistance is desired, a burried layer 98 of N+-type should be formed in the substrate, as shown in FIGS. 9(*a*) to 9(*f*).

Example 6

Referring now to FIGS. 10(*a*) to 10(*e*), a method for fabricating a PNP type transistor according to the invention will be described hereinbelow.

At first, as shown in FIG. 10(*a*), a P-type silicon epitaxial layer 142 is grown up to about 5$\mu$ thickness on a surface of a P+-type silicon monocrystalline substrate 140 and an insulating film 144, such as a silicon oxide film, of about 5000 A. to 8000 A. thickness is formed on the major surface of the epitaxial layer 142 with a ring shaped opening 146. Then as shown in FIG. 10(*b*), germanium or tin is selectively diffused into the layer 142 through the opening 146 to form a first diffused region 148 of about 7$\mu$ thickness with a surface concentration of not less than $10^{18}$ atoms/cm$^3$. In this step a new thin oxide film 150 is formed on the surface of the region. Then, as shown in FIG. 10(*c*), an opening 152 is formed in the film 144 to expose the center part of the major surface of the epitaxial layer 142 and an N-type impurity such as arsenic or antimony is diffused through the opening 152 to form an N-type diffused region 154 of about 2.5$\mu$ thickness. A new thin silicon film 156 covers the surface of the region 154. Two openings 158 and 160 are formed in the film 144 to expose the surface of the first region 148 with a ring shape and the surface of the N-type region 154. Thereafter, boron is diffused through the openings 158 and 160 to form a P+-type diffused region 162 of about 7$\mu$ thickness and a P+-type emitter region 164 of about 2$\mu$ thickness at the same time. New thin silicon oxide films are formed on the surface of the P+-type region in this step also. Finally, as shown in FIG. 10(*e*), a collector metal electrode 166, an emitter metal electrode 168 and a base metal electrode 170 are formed to ohmically contact with the regions 162, 164 and 154, respectively. In this structure of a PNP transistor, the P+-type ring shaped region 162 very effectively prevents the channel layer caused by the film 144 from affecting the various electric characteristics of the transistor. Moreover, all metal electrodes are obtainable on a common major surface since the P+-type region 162 connected to the substrate 140 is very easily obtained according to the invention.

Example 7

FIG. 11(*a*) shows a circuit diagram for an insulated gate type field effect transistor with a protective means. Referring now to FIG. 11(*b*), a method for fabricating such a transistor and the product thereby will be explained. The transistor is fabricated by the following steps: covering a major surface of an N-type silicon substrate where the first regions have not been formed; a silicon oxide film of about 5000 A. thickness; forming a pair of openings for a source and drain region in the film; diffusing germanium or tin into the substrate 180 through the openings and forming a pair of first regions 184 and 186 of about 3$\mu$ depths thereby; covering the openings with thin oxide films; forming three openings in the film including the new oxide film to partially expose the surface of the pair of first diffused regions 184 and 186 and another portion of the major surface of the substrate where the first regions have not been formed; diffusing boron through the openings into the pair of regions 184 and 186 and the other portion at the same time and forming P-type diffused regions 188, 190 and 192, respectively; providing metal electrodes 194, 196, 198, 200 and 202 on the predetermined positions; and electrically connecting a gate electrode with metal electrode 200 formed on the region 192. In this embodiment it is highly desirable to form the P-type region 192 to only a very shallow extent, for example, with a depth of not more than 0.5$\mu$ in order to make the breakdown voltage of the PN junction 193 very low, for example, 20 v. to 40 v. Boron is diffused very deeply in the germanium or tin diffused regions 184 and 196, for example, with depths of 2.5$\mu$ to 3$\mu$, while boron is diffused into the substrate with a depth of 0.3$\mu$ to 0.5$\mu$.

As mentioned above in connection with the examples, diffusion regions with differing depths are easily obtained by the same diffusion step at the same time and the difference between the diffusion depths is kept to a predetermined value by properly fixing the amount, depth and/or area for the non-conductivity type determining impurity according to the invention. Furthermore, it is to be understood that the conductivity type determining impurity does not always need to be selectively diffused into the element diffused region. In case, for example, a second conductivity type determining impurity is diffused into the major surface of the semiconductor substrate including the surface of the element diffused region, a P-N junction having partially different depths is formed between the second conductivity type region and the substrate.

In the above specific examples, a silicon crystalline body was used the semiconductor substrate to simplify the explanation of the invention. In case a germanium body is used as the semiconductor substrate, however, it is desirable to use tin, titanium, zirconium, lead or hafnium as the non-conductivity type determining impurity. It is therefore apparent that the Group IV impurity diffused into the semiconductor substrate should have an ionic radius greater than the ionic radius of the element constituting the substrate in order to raise the diffusing speed of a subsequently diffused conductivity type determining impurity.

Thus, although the invention has been described with a certain degree of particularity, it is understood that the present disclosure has been made only by way of example and that many various changes in the details of construction and the combination may be resorted to without departing from the spirit and the scope of the invention as hereinafter claimed.

It is claimed:

1. A method for manufacturing a semiconductor integrated circuit device comprising the steps of:

(a) selectively diffusing a chemical element selected from the group consisting of germanium and tin into the major surface of a silicon semiconductor substrate having a first conductivity type to form a first diffused region with a lattice shape at the major surface of said substrate and with surface concentration thereof not less than $10^{16}$ atoms/cm.$^3$;

(b) epitaxially depositing a silicon semiconductor layer of a second conductivity type opposite to the first conductivity type on the major surface of said substrate, whereby said lattice shaped first region is buried under said layer;

(c) selectively diffusing a chemical element selected from the group consisting of germanium and tin into a portion of said layer positioned above said lattice shaped first diffused region to form a lattice shaped second diffused region having surface concentration thereof not less than $10^{18}$ atoms/cm.$^3$ and connected to said first diffused region is said layer, whereby plural second conductivity type regions wherein said second diffused region has not been formed are segregated by said lattice shaped second region at the surface of said layer; and (d) selectively diffusing an impurity which determines the first conductivity type into said lattice shaped second diffused region to form a third diffused region of the first conductivity type extending to said substrate in said layer, whereby said plural second conductivity type regions are electrically isolated from each other by said lattice shaped third region and said substrate of the first conductivity type.

2. A method for manufacturing a semiconductor device comprising the steps of:

(a) preparing a silicon semiconductor substrate of a first conductivity type having a relatively low resistivity and having a major surface;

(b) epitaxially depositing a silicon semiconductor layer of the first conductivity type having a relatively high resistivity on the major surface of said substrate;

(c) selectively diffusing into said deposited layer a chemical element selected from the group consisting of germanium and tin to form a first diffused region with a surface concentration thereof not less than $10^{18}$ atoms/cm.$^3$ therein extending to the major surface of said substrate;

(d) selectively diffusing a second conductivity type determining impurity into a surface portion of said deposited layer different from the surface area comprising said first diffused region to form a second diffused region of the second conductivity type in said deposited layer; and (e) selectively diffusing the first conductivity type determining impurity into said first diffused region to form a third diffused region of the first conductivity type extending to said substrate therein and into said second diffused region to form a fourth diffused region of the first conductivity type therein.

References Cited

UNITED STATES PATENTS

| | | | |
|---|---|---|---|
| 2,937,961 | 5/1960 | Wolsky | 148—186 |
| 3,513,363 | 5/1970 | Herlet | 148—186 |
| 3,493,443 | 2/1970 | Cohen | 148—186 |
| 3.410,736 | 11/1968 | Tokuyama | 148—186 |
| 3,485,684 | 12/1969 | Mann | 148—190 |
| 3,486,950 | 12/1969 | Lesk | 148—190 |
| 3,183,129 | 5/1965 | Tripp | 148—187 |
| 3,422,322 | 1/1969 | Haisty | 148—190 |
| 3,493,443 | 2/1970 | Cohen | 148—190 |
| 3,615,929 | 10/1971 | Portney. | |

HYLAND BIZOT, Primary Examiner

U.S. Cl. X.R.

148—187